US012607693B2

(12) United States Patent
Shcherback et al.

(10) Patent No.: US 12,607,693 B2
(45) Date of Patent: Apr. 21, 2026

(54) LIGHT MODULATED OPTICALLY PUMPED MAGNETOMETER SYSTEM AND METHOD

(71) Applicant: Elta Systems Ltd., Ashdod (IL)

(72) Inventors: Igor Shcherback, Beer Sheva (IL); Dmitriy Tokar, Beer Sheva (IL)

(73) Assignee: Elta Systems Ltd., Ashdod (IL)

( * ) Notice: Subject to any disclaimer, the term of this patent is extended or adjusted under 35 U.S.C. 154(b) by 138 days.

(21) Appl. No.: 18/582,461

(22) Filed: Feb. 20, 2024

(65) Prior Publication Data

US 2024/0280653 A1     Aug. 22, 2024

(30) Foreign Application Priority Data

Feb. 22, 2023   (IL) .......................................... 300877

(51) Int. Cl.
*G01R 33/26* (2006.01)

(52) U.S. Cl.
CPC .................................... *G01R 33/26* (2013.01)

(58) Field of Classification Search
CPC .. G01R 33/0029; G01R 33/26; G01R 33/032; G01R 33/0041; G01R 33/007; G01R 23/005; G01R 23/16; G01R 29/023; G01R 29/26
USPC ....................................................... 324/305
See application file for complete search history.

(56) References Cited

U.S. PATENT DOCUMENTS

| | | | | |
|---|---|---|---|---|
| 4,563,646 A | * | 1/1986 | Desormiere ............ | H01S 3/102 |
| | | | | 324/244.1 |
| 5,272,436 A | * | 12/1993 | Chaillout ............... | G01R 33/26 |
| | | | | 324/304 |
| 5,534,776 A | * | 7/1996 | Leger ..................... | G01R 33/26 |
| | | | | 324/304 |
| 2008/0290867 A1 | | 11/2008 | Smith | |

(Continued)

OTHER PUBLICATIONS

Katsoprinakis, G. E., A. T. Dellis, and I. K. Kominis. "Measurement of transverse spin-relaxation rates in a rubidium vapor by use of spin-noise spectroscopy." Physical Review A—Atomic, Molecular, and Optical Physics 75.4 (2007): 042502. (Year: 2007).*

(Continued)

*Primary Examiner* — Christopher P McAndrew
(74) *Attorney, Agent, or Firm* — The Roy Gross Law Firm, LLC; Roy D. Gross

(57) ABSTRACT

An optical magnetometer system and method for operation thereof are described. The optical magnetometer system comprises: at least one light source emitting one or more illumination beams and scanning frequency of illumination beams over a selected range; at least one vapor cell having alkali atoms positioned within path of the illumination beam; a detection unit position to collect beam passing though the vapor cell; at least one thermal unit positioned to vary temperature of the vapor cell; and a controller configured and operable for obtaining detection data from the detection unit and for operating said at least one thermal unit in a feedback loop, and wherein said feedback loop being directed at maintaining a relation between optical intensity (Continued)

measured at one of more measurement points associated with selected frequencies and detuning level at the one or more measurement points from Larmor frequency of the optical magnetometer system.

16 Claims, 5 Drawing Sheets

(56) References Cited

U.S. PATENT DOCUMENTS

| | | | |
|---|---|---|---|
| 2014/0159718 A1* | 6/2014 | Larsen .................. | G01R 33/26 |
| | | | 324/301 |
| 2014/0320123 A1* | 10/2014 | Kobayashi ............. | G01R 33/26 |
| | | | 324/244.1 |
| 2015/0330786 A1 | 11/2015 | Bulatowicz | |
| 2017/0276741 A1 | 9/2017 | Bulatowicz | |
| 2021/0033686 A1* | 2/2021 | Garces Malonda ... | G01K 13/00 |
| 2023/0243901 A1* | 8/2023 | Shcherback ........... | G01R 33/26 |
| | | | 324/304 |

OTHER PUBLICATIONS

Yan, Y. et al. 2021. "The influence of temperature and modulated magnetic field on the transmission intensity of atomic magnetometer" J. Phys. D: Appl. Phys. 54 (2021) 485001 (8pp).
Yan, Y. et al. 2021. "The influence of temperature and modulated magnetic field on the transmission intensity of atomic magnetometer".

* cited by examiner

LIGHT MODULATED OPTICALLY PUMPED MAGNETOMETER SYSTEM AND METHOD

CROSS REFERENCE TO RELATED APPLICATIONS

This application claims the benefit of priority to Israeli Application No. 300877 filed Feb. 22, 2023, the contents of which are all incorporated herein by reference in their entirety.

TECHNOLOGICAL FIELD

The present disclosure is in the field of magnetometer systems and methods for operation thereof, and specifically relates to optical magnetometer systems and methods for calibration and optimization of optical magnetometer systems.

BACKGROUND

Light modulated Optical Magnetometers (OPMs) provide detection of magnetic field and variation thereof using variation in optical characteristics of light transmitted through vapor of selected atoms. Optical magnetometers typically utilize a vapor cell containing vapor of alkali atoms (e.g., cesium) and buffer gas(es), and operate by transmitting light through the vapor cell to produce an output signal having frequency components' indicative of the magnetic field which is to be sensed.

Generally, output signal of the optical magnetometer indicates magnitude of magnetic field. However, the output signal and signal to noise ratio (SNR) of the output signal depend on density of the alkali atoms in the vapor cell, and thus in additional conditions such as temperature, and light intensity transmitted through the vapor cell.

GENERAL DESCRIPTION

The present disclosure provides an optical magnetometer system and a method for operating an optical magnetometer system having enhanced sensitivity and detection accuracy. To this end the present technique provides feedback control over temperature and illumination intensity conditions of alkali atoms vapor located within a vapor cell (chamber) and maintaining desired conditions to optimize sensitivity of the optical magnetometer with respect to vapor density variations.

Output signal in optical magnetometer systems is typically dependent on the density of the vapor of the alkali atoms interacting with light beam passing through the vapor cells and operating to detect response of the alkali atoms in the vapor cells and surrounding magnetic field. Further, the atom density is highly temperature dependent, and may double due to increase of 10° C. in temperature.

Up to a certain level, increase in atom density enhances signal level and thus improved operation efficiency of the optical magnetometer system. At density above an optimal operation density, the atomic vapor becomes opaque to the resonant light and attenuates the output signal. This impairs the ability to obtain accurate measurements form the optical magnetometer system.

Accordingly, the present disclosure provides for controlling operation temperature, and illumination intensity of an optical magnetometer system to yield accurate measurements of the magnetic field having high SNR.

The present technique may utilize a feedback control circuit to maintain operation temperature and illumination intensity, e.g., provided by one or more laser units, within the vapor cell balancing vapor density and accordingly signal to noise ratio in detection of magnetic fields.

Thus, according to a broad aspect, the present disclosure provides an optical magnetometer system comprising:

at least one light source operable for emitting one or more illumination beams and scanning illumination frequency of said one or more illumination beams over a selected frequency range;

at least one vapor cell comprising vapors of one or more alkali atoms and buffer gas, and positioned to allow illumination beam from the at least one light source to pass through the vapor cell;

a detection unit position to collect illumination beam passing though said at least one vapor cell and generate detection data indicative of at least one of light absorption and degree of polarization of output light emitted through the at least one vapor cell;

at least one thermal unit positioned and adapted for selectively varying temperature of said at least one vapor cell; and a controller configured and operable for obtaining detection data from the detection unit and for operating said at least one thermal unit in a feedback loop, and wherein said feedback loop being directed at maintaining a relation between optical intensity measured at one of more measurement points associated with selected frequencies and detuning level at the one or more measurement points from Larmor frequency of the optical magnetometer system.

According to some embodiments, the at least one light source may be operable for emitting one or more illumination beams having circular polarization.

According to some embodiments, the detection unit may comprise at least one polarization analyzer and at least one detector unit and configured to generate output data indicative of intensity of light collected by the at least one detector unit. (polarization analyzer may be polarization beam splitter, polarization filter etc.)

According to some embodiments, the at least one light source and the detection unit may be operable together to provide detection data indicative of at least one of light absorption and degree of polarization of output light for one or more illumination frequencies scanned by said at least one light source.

According to some embodiments, the said at least one light source may be configured to scan illumination frequency within a dynamic scan range, and wherein range of scanning is determined in accordance with data about Larmor frequency associated with magnetic field.

According to some embodiments, the optical magnetometer system may be operable in cyclic sampling and wherein a measurement cycle comprises scanning illumination frequency and determining a frequency associated with an extreme value of collected light by the detection unit.

According to some embodiments, the controller may operate for maintaining said relation between optical intensity measured at one of more measurement points and detuning of said one or more measurement points at a calibration sampling rate lower than measurement sampling rate of the optical magnetometer defined by measurement cycles thereof.

According to some embodiments, scanning illumination frequency of said one or more illumination beams may comprise frequency and/or amplitude scan.

According to some embodiments, the controller may be configured for:

obtaining, from the detection unit, detection data indicative of absorption of the respective optical magnetometer units for one or more frequencies within said frequency range;

processing said detection data to determine current Larmor frequency associated with maximal absorption, and determining one or more measurement points being detuned from the current Larmor frequency;

generating operational temperature instructions to vary at least one of operation temperature of the vapor cell and intensity of one or more illumination beams to maintain a ration between detuning level and measured optical intensity at said one or more measurement points.

According to some embodiments, the controller may be configured to operate in a feedback loop processing to maintain a desired relation between measured optical intensity and detuning level at the selected one or more measurement points.

According to some embodiments, the controller may be further configured to determine data on collected light intensity at said one or more measurement points and determining data on a Q parameter being a relation between detuning of said one or more measurement points and respective collected light intensity.

According to some embodiments, the controller may further comprise pre stored data indicative of a reference Q parameter, said controller is configured to determine of a relation between said data on a Q parameter and said reference Q parameter is within a predetermined threshold, and operate said at least one thermal unit to vary operation temperature to thereby bring said relation within aid predetermined threshold.

According to some embodiments, the controller may further comprise pre stored data indicative of a reference Q parameter, said controller is configured to determine if a relation between said data on a Q parameter and said reference Q parameter is within a predetermined threshold, and operate said light source to vary illumination intensity to thereby bring said relation within said predetermined threshold.

According to some embodiments, the controller may be configured and operable to perform an initialization operation cycle upon initialization of operation of the optical magnetometer system, said initialization operation comprises determining said reference Q parameter and storing said reference Q parameter in a storage unit for later use.

According to some embodiments, the one or more measurement points may be determined within a frequency range distanced from the Larmor frequency by at least a first frequency difference and below a second frequency difference.

According to some embodiments, a curve of said detection data with respect to frequency scan may be estimated by a curve having an extremum at Larmor frequency and a typical width around said extremum, said first frequency difference is determines at $1/e^2$ of the width.

According to some embodiments, the curve of said detection data with respect to frequency scan may be estimated by a curve having an extremum at Larmor frequency and a typical width around said extremum, said second frequency difference is determined at 36 of the width, wherein a relates to standard deviation.

It should be understood that the system according to the invention may be a suitably programmed computer. Likewise, the invention contemplates a computer program being readable by a computer for executing the method of the invention. The invention further contemplates a machine-readable memory tangibly embodying a program of instructions executable by the machine for executing the method of the invention.

According to one other broad aspect, the present disclosure provides a method for operating one or more optical magnetometer units, the method comprising:

directing one or more illumination beams onto one or more vapor cells and performing a frequency scan within a selected frequency range;

collecting data on at least one of light absorption and degree of polarization of light passing through said one or more vapor;

determining extremum in said data on at least one of light absorption and degree of polarization and determining one or more measurement points being detune from said extremum;

varying at least one of temperature of said one or more vapor cells and intensity of said one or more illumination beams in a feedback loop to maintain a relation between optical intensity measured at said one of more measurement points associated with selected frequencies and detuning level at the one or more measurement points.

According to some embodiments, the method may comprise operation in a cyclic sampling wherein a measurement cycle comprises scanning illumination frequency and determining a frequency associated with an extreme value of polarization of collected light by the detection unit.

According to some embodiments, the method may be performed in a calibration rate being lower than sampling rate of the optical magnetometer.

According to some embodiments, scanning the illumination frequency of said one or more illumination beams may comprise frequency and/or amplitude scan.

According to some embodiments, the method may further comprise:

obtaining, from a detection unit, detection data indicative of absorption of the respective optical magnetometer units for one or more frequencies within said frequency range;

processing said detection data to determine current Larmor frequency associated with maximal absorption, and determining one or more measurement points being detuned from the current Larmor frequency;

generating operational temperature instructions to vary at least one of operation temperature of the vapor cell and intensity of one or more illumination beams to maintain a ration between detuning level and measured optical intensity at said one or more measurement points.

According to some embodiments, the method may further comprise determining data on collected light intensity at said one or more measurement points and determining data on a Q parameter being a relation between detuning of said one or more measurement points and respective collected light intensity.

According to some embodiments, the method may utilize pre stored data indicative of a reference Q parameter, the method comprises determining a relation between said data on a Q parameter and said reference Q parameter and determining if said relation is within a predetermined threshold, and operating said at least one thermal unit to vary operation temperature to thereby bring said relation within aid predetermined threshold.

According to some embodiments, the one or more measurement points may be within a frequency range distanced from the Larmor frequency by at least a first frequency difference and below a second frequency difference.

According to some embodiments, the method may comprise determining an estimate curve of said detection data with respect to frequency scan by a curve having an extremum at Larmor frequency and a typical width around said extremum, said first frequency difference is determines at $1/e^2$ of the width.

According to some embodiments, the method may comprise determining the curve of said detection data with respect to frequency scan as being estimated by a curve having an extremum at Larmor frequency and a typical width around said extremum, said second frequency difference is determined at 36 of the width, wherein a relates to standard deviation.

According to yet another broad aspect, the present disclosure provides a method for controlling operation of one or more optical magnetometer units, the method comprising:

generating operational instructions to a light source unit for performing a frequency scan within a predetermined operation frequency range;

obtaining, from one or more detectors of said one or more optical magnetometers, detection data indicative of absorption of the respective optical magnetometer units for one or more frequencies within said frequency range;

processing said detection data to determine current Larmor frequency associated with absorption extremum, and determining one or more measurement points being detune from the current Larmor frequency;

generating operational temperature instructions to one or more heating units positioned for varying temperature of said one or more optical magnetometer units;

generating operational light intensity instructions to light source for illuminating said one or more optical magnetometer units;

operating a feedback loop control to maintain desire relation between measured optical intensity and detuning level at the selected one or more measurement points.

According to yet another broad aspect, the present disclosure provides a program storage device readable by machine, tangibly embodying a program of instructions executable by the machine to perform a method for controlling operation of one or more optical magnetometer units, the method comprising:

generating operational instructions to a light source unit for performing a frequency scan within a predetermined operation frequency range;

obtaining, from one or more detectors of said one or more optical magnetometers, detection data indicative of absorption of the respective optical magnetometer units for one or more frequencies within said frequency range;

processing said detection data to determine current Larmor frequency associated with absorption extremum, and determining one or more measurement points being detune from the current Larmor frequency;

generating operational temperature instructions to one or more heating units positioned for varying temperature of said one or more optical magnetometer units;

generating operational light intensity instructions to light source for illuminating said one or more optical magnetometer units;

operating a feedback loop control to maintain desire relation between measured optical intensity and detuning level at the selected one or more measurement points.

According to yet another broad aspect, the present disclosure provides a computer program product comprising a computer useable medium having computer readable program code embodied therein for controlling operation of one or more optical magnetometer units, the computer program product comprising:

computer readable program code for causing the computer to generate operational instructions to a light source unit for performing a frequency scan within a predetermined operation frequency range;

computer readable program code for causing the computer to obtain, from one or more detectors of said one or more optical magnetometers, detection data indicative of absorption of the respective optical magnetometer units for one or more frequencies within said frequency range;

computer readable program code for causing the computer to process said detection data to determine current Larmor frequency associated with absorption extremum, and determining one or more measurement points being detune from the current Larmor frequency;

computer readable program code for causing the computer to generate operational temperature instructions to one or more heating units positioned for varying temperature of said one or more optical magnetometer units;

computer readable program code for causing the computer to generate operational light intensity instructions to light source for illuminating said one or more optical magnetometer units;

computer readable program code for causing the computer to operate a feedback loop control to maintain desire relation between measured optical intensity and detuning level at the selected one or more measurement points.

According to yet another broad aspect, the present disclosure provides a program storage device readable by machine, tangibly embodying a program of instructions executable by the machine to perform a method for operating one or more optical magnetometer units, the method comprising:

directing one or more illumination beams onto one or more vapor cells and performing a frequency scan within a selected frequency range;

collecting data on at least one of light absorption and degree of polarization of light passing through said one or more vapor;

determining extremum in said data on at least one of light absorption and degree of polarization and determining one or more measurement points being detune from said extremum;

varying at least one of temperature of said one or more vapor cells and intensity of said one or more illumination beams in a feedback loop to maintain a relation between optical intensity measured at said one of more measurement points associated with selected frequencies and detuning level at the one or more measurement points.

According to yet another broad aspect, the present disclosure provides a computer program product comprising a computer useable medium having computer readable program code embodied therein for operating one or more optical magnetometer units, the computer program product comprising:

computer readable program code for causing the computer to direct one or more illumination beams onto one or more vapor cells and performing a frequency scan within a selected frequency range;

computer readable program code for causing the computer to collect data on at least one of light absorption and degree of polarization of light passing through said one or more vapor;

computer readable program code for causing the computer to determine extremum in said data on at least one of light absorption and degree of polarization and determining one or more measurement points being detune from said extremum;

computer readable program code for causing the computer to vary at least one of temperature of said one or more vapor cells and intensity of said one or more illumination beams in a feedback loop to maintain a relation between optical intensity measured at said one of more measurement points associated with selected frequencies and detuning level at the one or more measurement points.

BRIEF DESCRIPTION OF THE DRAWINGS

In order to better understand the subject matter that is disclosed herein and to exemplify how it may be carried out in practice, embodiments will now be described, by way of non-limiting example only, with reference to the accompanying drawings, in which.

DETAILED DESCRIPTION OF EMBODIMENTS

Optical magnetometers provide efficient and sensitive detection of magnetic fields and variation thereof. As indicated above, Optical magnetometers may be sensitive of variation in density of atomic vapor, which acts as magnetic sensitive media. Optimization of temperature and/or optical intensity in measurement the effect of magnetic field on the atomic vapor can provide for increased signal to noise ratio (SNR).

Figure 1:
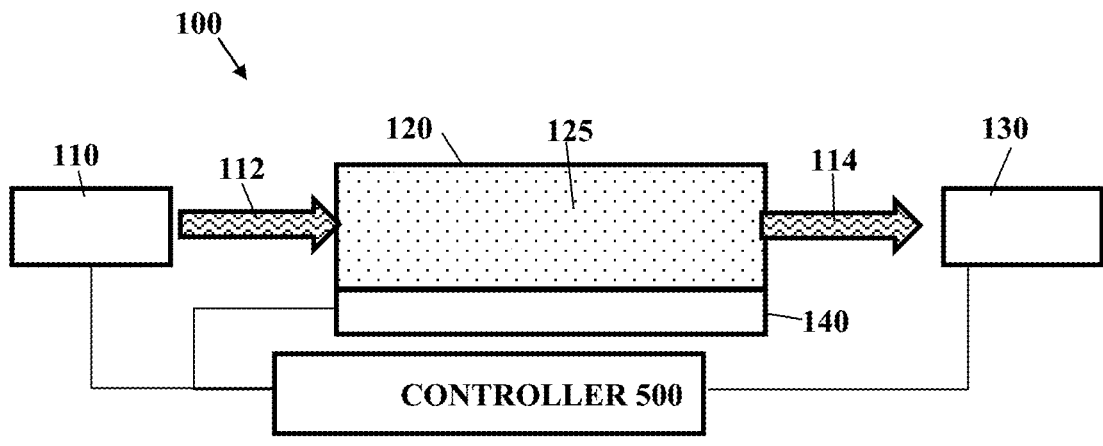
FIG. 1 illustrates schematically an optical magnetometer system according to some embodiments of the present disclosure.

Reference is made to FIG. 1 illustrating schematically an optical magnetometer system 100 according to some embodiments of the present disclosure. System 100 includes a light source 110 (typically including one or more laser units) operable for emitting a generally coherent illumination 112 and capable of scanning wavelength (frequency) of the illumination within a selected wavelength range. Illumination beam 112 emitted from the light source 110 is directed to pass through a chamber 120 having vapor of one or more selected atoms 125 to provide output beam 114 directed toward a detector 130.

Additionally, system 100 includes a controller 500 and a thermal unit 140. The controller is operable for operating the light source 110 and for receiving detection data from the detector 130. The controller is also connected and configured to operate the thermal unit 140 for selectively varying temperature of the chamber 120 and atomic vapor 125 therein. According to some embodiments of the present disclosure, the controller 500 operate the thermal unit 140 for adjusting operation temperature of the chamber 120 to maintain a relation between optical intensity measured at one or more selected frequencies, detuned from Larmor frequency, and the respective detuning level of these one or more selected frequencies from the Larmor frequency. Further, according to some embodiments of the present disclosure, the controller 500 may operate the light source 110 for adjusting illumination intensity of light beam 112 illuminating, and pumping, the one or more selected atoms 125 in chamber 120 to maintain a relation between optical intensity measured at one or more selected frequencies, detuned from Larmor frequency, and the respective detuning level of the one or more selected frequencies from the Larmor frequency. Generally, in some embodiments, the controller 500 may operate both the thermal unit 140 and the light source 110 to maintain the selected relation between detuning and collected intensity at the one or more selected measurement points.

In this connection, a typical optical magnetometer utilizes atomic vapor of one or more alkali atoms such as, sodium, potassium, rubidium, cesium, etc. Typically, the chamber 120 may also include a selected combination of one or more buffer gases (herein referred to as buffer gas) to confine the movement of the alkali atoms within the cell, reduce interaction rate of alkali atoms with the cell walls and in-between the alkali atoms, and thus to allow maintaining coherence of the alkali atoms 125. Optical illumination 112, generally having circular polarization is directed through the chamber 120, aligning spin orientation of the alkali atoms 125. Due to external magnetic field, the alignment may be incomplete and the spin orientation of the alkali atoms 125 may precess around the magnetic field vector with a characteristic frequency, a.k.a. Larmor frequency, causing variation in transmission properties of the vapor 125. This results in variation (e.g., reduction or increase) in transmission of the atomic vapor 125 providing a measurable change in optical intensity measured by the detector 130. At resonance, while the frequency of the modulated light equals the Larmor frequency, this variation is maximal and provides clear indication (measurement) of applied magnetic field being extremum in transmission of light through the chamber 120.

Generally, as indicated, the atomic vapor 125 within the chamber 120 is optically pumped by pumping illumination into a magnetically sensitive state. Presence of external magnetic field changes the state of the atomic vapor 125 and as a result the pumping beam, which bringing it to the desired magnetically sensitive state, is further absorbed by the atomic vapor, and the illumination intensity detected by the detector 130 is varied. At resonance, while the frequency of the modulated light equals the Larmor frequency, this variation is maximal and provides clear indication (measurement) of the external magnetic field.

Typically, vapor cell may hold a selected mixture of the alkali atoms and buffer gas at certain ratio and pressure. The pressure may vary with temperature, in accordance with typical gas behavior. Additionally, the atomic vapor 125 of the one or more alkali atoms may generate one or more phases including atomic vapor 125 phase, and optionally an aggregated phase that typically does not take part in detection of magnetic field variation. The possible presence of aggregated phase may enhance temperature dependency by leading to variation of number of alkali atoms in the gas phase and thus change atomic density within the chamber 120.

It should be noted that optical magnetometer system 100 may include one or more light source unit 110, e.g., utilizing a pump beam and a prob beam. Further optical magnetometer system may include a selected number of vapor chambers providing an array of magnetometer units. The system may include an optical arrangement for directing light beam 112 from the light source 110 into the one or more vapor chambers 120, and collection optical arrangement for directing light from the vapor chambers 120 to respective one or more detectors 130. Such optical arrangements may include one or more optical elements such as one or more lenses, mirrors, polarization filters, polarization rotators, optical fibers etc. In some embodiments the system may include an arrangement of two or more vapor chambers, each associated with illumination beams having different two or more optical axes, enabling detection of direction and vector characteristics of magnetic field.

The output signal, or level of variation in light intensity detected by the detector 130, providing indication to external magnetic field, is dependent of density of the atomic vapor within the chamber. More specifically, the magnetometer output optical signal can be represented by $I = I_0 e^{-nl\sigma_{eff}}$ where n is the atomic density, which is exponentially dependent on temperature, an $\sigma_{eff}$ is the effective atomic cross-section, and l being effective length of path through the chamber.

In some configurations, the atomic vapor 125 within the chamber 120 may include atomic vapor state and condensed state (liquid and/or solid) of the alkali atoms, depending on pressure. This results in certain relation between the atomic density of the alkali atoms and temperature within the chamber 120. Additionally, the effective atomic cross-section $\sigma_{eff}$ reflects effects as the relaxation rate, spin, atomic depolarization dynamics, and thus is also dependent on the temperature. As a result, the optical output signal of the optical magnetometer system is temperature dependent. Moreover, light absorption in the vapor cell and depolarization rate of the atomic vapor act as two effects having different temperature dependency. The inventors of the present disclosure have found that balancing the different temperature dependency is needed to provide improved accuracy and sensitivity in detection of magnetic fields, and increasing SNR of the optical magnetometer system.

Accordingly, the present disclosure utilizes real-time monitoring and control over atomic density and depolarization rate of the atomic vapor 125 within the chamber 120. To this end, the present disclosure utilizes monitoring of and selective variation of at least one of temperature of the atomic vapor 125 and photonic flux (or intensity of illumination 112) through the chamber 120.

In this connection, a typical operation of the optical magnetometer includes frequency scan of illumination beam 112 emitted by the light source 110, and detection of a Larmor frequency, associated with maximal absorption, or minimal transmission of the beam by the vapor 125 in chamber 120. The controller 500 receives detection data and respective operation data indicative of frequency (wavelength) of emission to determine a frequency associated with maximal absorption. Using the so-determined Larmor frequency, the controller may utilize pre-stored data on characteristics of the chamber 120 and atomic vapor 125 to determine data on magnetic field variations around the chamber 120.

To optimize sensitivity according to some embodiments of the present disclosure, the controller may further utilize detection data associated with one or more measurement points defined by emission frequency detuned from the Larmor frequency. The controller 500 thus operate to vary at least one of illumination intensity of the light source 110 and temperature of the chamber 120 to maintain a relation between detected intensity at the one or more measurement points and detuning level of the one or more measurement points with respect to the Larmor frequency.

In this connection, the controller 500 includes at least one processor and memory circuitry (PMC) operatively coupled to a hardware-based input/output interface for receiving and transmitting operational instructions to the light source 110, detector 130 and thermal unit 140. The controller may also have a communication interface for obtaining updated instructions and/or external data, and to provide output data indicative of detected magnetic field variations. The PMC is configured and operable for executing computer readable instructions, generally stored at the memory thereof, and/or accessible via an input connection, to perform the operation task described herein.

Figure 2:
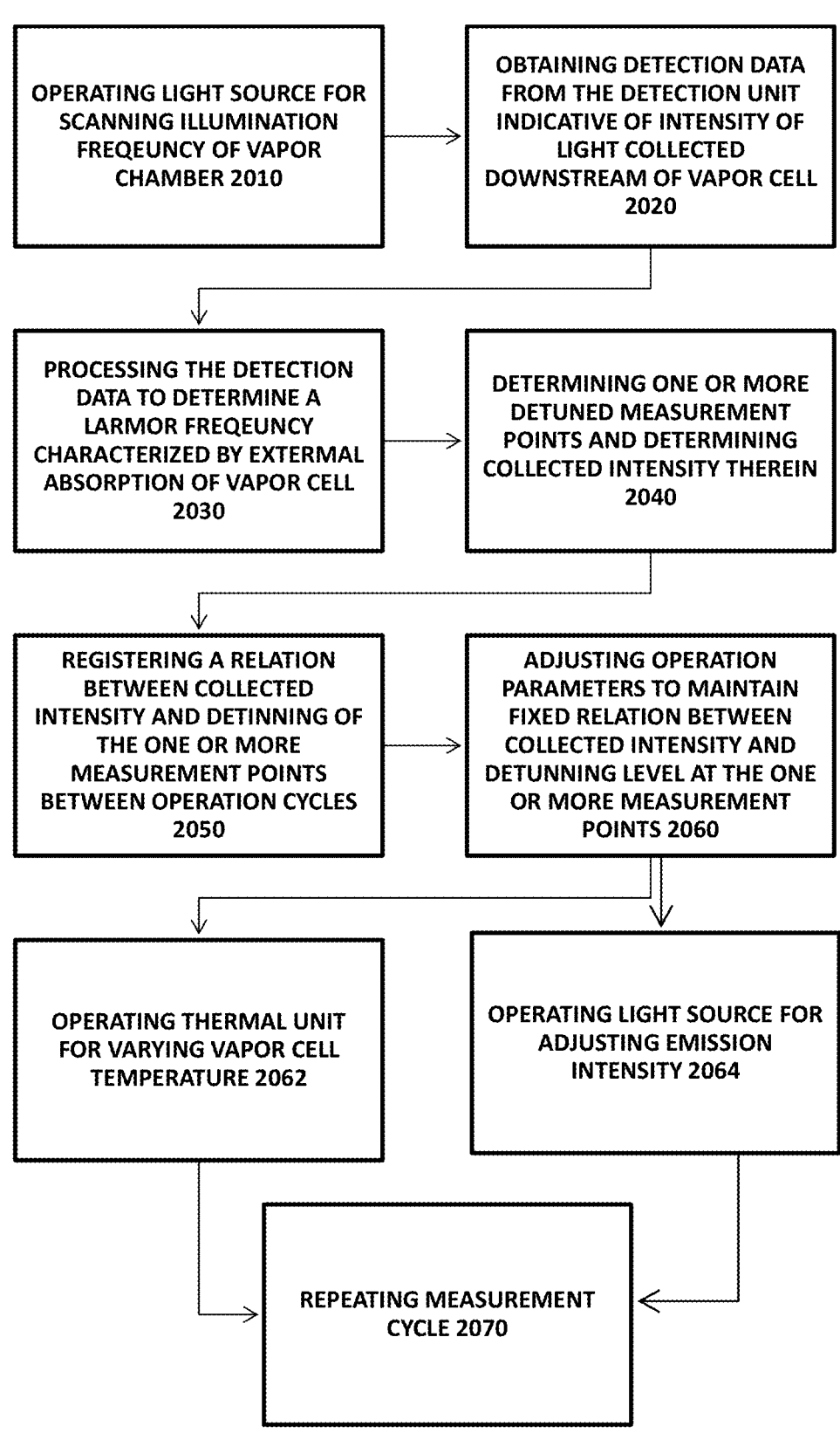
FIG. 2 exemplifies a method of operation of optical magnetometer system according to some embodiments of the present disclosure.

Reference is made to FIG. 2 illustrating a method according to some embodiments of the present disclosure for operating and improving operation of one or more optical magnetometer units. Generally, as indicated above, the optical magnetometer system includes a controller configured and operable for obtaining detection data from the detection unit and determining magnetic field variation. The controller may also be configured for operating the at least one thermal unit, and/or light source, in a feedback loop at maintaining a relation between optical intensity measured at one of more selected frequencies and detuning level at the one or more selected frequencies from Larmor frequency of the optical magnetometer system. As illustrated, the method includes operating light source unit for scanning illumination frequency and transmitting the respective illumination toward the vapor cell 2010. The method further includes obtaining detection data, from the detector unit 2020. The detection data generally includes a set of optical intensity data pieces detected with respect to a set of illumination frequencies transmitted into the vapor cell. To determine data on magnetic field and/or variation thereof, the method includes processing the detection data to determine Larmor frequency characterized as being extremum in the collected intensity 2030. The so determined Larmor frequency is indicative of magnetic field affecting the atomic vapor within the vapor cell. Generally, the optical magnetometer system repeats this set of actions in a selected sampling rate to monitor magnetic field and/or its variations around the vapor cell. The repeated sampling by frequency scan and determining Larmor frequency with each scan enables optimization of at least one of vapor cell temperature and illumination intensity as described herein.

As indicated above, the collected intensity of light passing through the vapor cell is at least partly affected by density of the atomic vapor, cross-section for interaction (polarization) of the atomic vapor and additional parameters. The present disclosure operates for calibrating the optical magnetometer system in accordance with at least one of operation temperature and illumination intensity, to enhance sensitivity of detection of magnetic field variation. To this end the present disclosure utilizes calibration of at least one of operation temperature within the vapor cell and intensity of optical illumination of the atomic vapor to maintain a relation between collected intensity and detuning at one or more measurement points detuned from the Larmor frequency. More specifically, the present disclosure may utilize selecting or determining one or more measurement points, detuned from the Larmor frequency, and determining collected intensity for the one or more measurement points 2040. Each of the one or more measurement points is distanced from the Larmor frequency, and a relation between the collected intensity at the measurement points and the respective detuning level is registered 2050. If any variation in the relation is determined between sampling cycles, the technique operates for adjusting one or more operation parameters to maintain the relation between detuning level and collected intensity at the one or more measurement points 2060. To this end, the technique may operate the thermal unit for varying operation temperature of the vapor cell 2062, and/or adjust illumination intensity provided by the light source 2064 to maintain detuning to collected intensity relation. Generally, the present technique may determine sampling rate and/or include certain relaxation/waiting time to allow temperature variation to settle before repeating the measurement cycle 2070.

In this connection it should be noted that the optical magnetometer system may operate in a selected sampling rate for providing data on variation of magnetic field with suitable sampling rate. However, the calibration of at least one of optical intensity and operation temperature as described herein may be performed at a second calibration rate, generally being lower than the sampling rate of measurements of magnetic field. For example, for an optical magnetometer system operating at a sampling rate of 1-500 cycles per second, the calibration rate may be at a rate of 1 cycle per second or lower, providing calibration cycle every 30 seconds, or every 1 minute etc. This lower calibration rate is referred to herein as waiting time. Indicating time in which the controller may proceed operation of detection of magnetic field, but does not operate the calibration measurements.

Accordingly, a general operation of the optical magnetometer system 100 includes illumination of the atomic vapor within the vapor cell with pumping light to maintain certain polarization of the atomic spin moments. As indicated above, this may be performed using circularly polarized illumination that interacts with the atomic spins, aligning them collinearly and thus providing the "polarization of atomic spins media". Presence of external magnetic fields causes coherent precession of the atomic spins moments, once the atomic spins are correspondingly polarized, varying the atom-light interaction. Accordingly, the optical magnetometer system may operate to scan illumination frequency within a selected range (typically within infrared frequency range), and in each scan, operates to determine maximal absorption of light associated with Larmor frequency and the external magnetic field.

Figure 3:
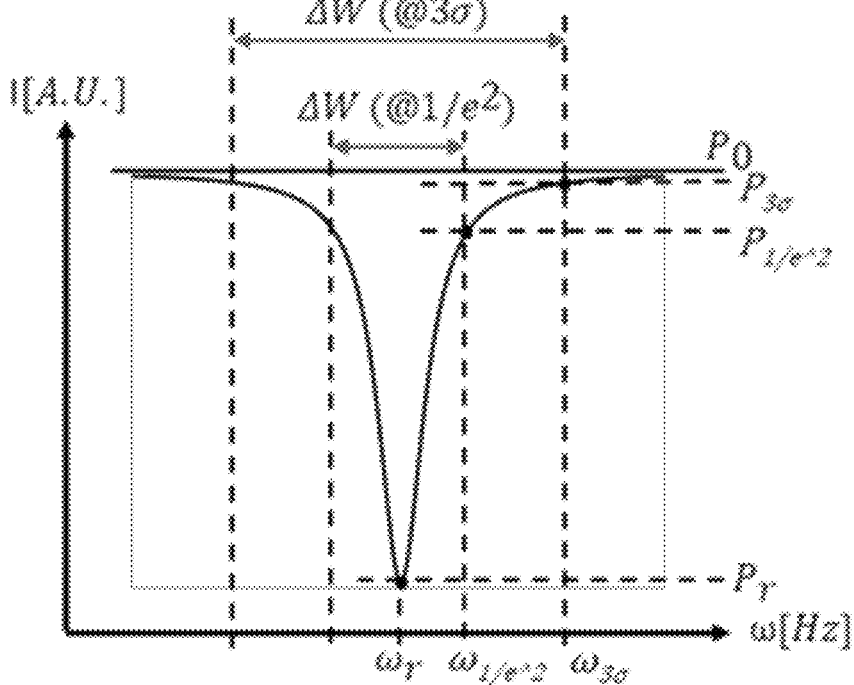
FIG. 3 exemplifies a collected signal curve of optical magnetometer system according to some embodiments of the present disclosure.

Aligning sensitivity of the optical magnetometer system according to some embodiments of the present disclosure can be achieved by probing/measuring the transmission of modulated light at one or more selected frequencies $F_r$, which is somewhat different by an interval $\delta\omega$ from the Larmor frequency $F_l$ (i.e., detuned from the Larmor frequency to avoid the excess polarization). The frequency difference (i.e., the detuning interval) $\delta\omega$ may be preselected in accordance with the Larmor frequency determined at one or more selected measurement cycles, and/or set to a preselected frequency and change the selected frequency after a number of measurement cycles to maintain sufficient detuning from the Larmor frequency. In this connection, FIG. 3 exemplifies collected intensity data I as a function of frequency $\omega$ of emitted light. FIG. 3 further illustrates a detuning region suitable for the one or more measurement points, selected for calibration of at least one of vapor cell temperature and illumination intensity of the magnetometer system. The measured response shown in FIG. 3, can be estimated as a function of detuning $\delta\omega=(\omega-\omega_r)$ from Larmor frequency $\omega_r$ ($\omega_r=2\pi F_1$), by estimating $$I = \frac{A}{1 + \delta\omega^2} + C,$$

where A is the signal intensity and C is a calibration offset. It should be noted that the present disclosure may be used by estimating the curve of intensity as a function of illumination frequency by Voigt, Lorentzian, Gaussian or other suitable functional relations.

As indicated above, the PMC may operate for analyzing the detection data for frequencies with range of frequency $\omega$ scan and determine the Larmor frequency. Once the resonance Larmor frequency $F_l$ is determined, the PMC may narrow frequency scan around the determine Larmor frequency $\omega_r$ or $F_l$ (e.g., to improve detection accuracy and/or sampling rate). The PMC may select one or more measurement points at one or more certain frequencies $F_t$ suitable for temperature calibration of the optical magnetometer.

The selected one or more measurement points are preferably selected to be within a predetermined range with respect to variation of absorption of light (and/or polarization rotation) by the atomic vapor 125. Accordingly, the one or more measurement points are selected within a frequency range being characterizes as further than Larmor frequency by at least a first frequency difference, but not further than a second frequency difference. This is to provide that the one or more measurement points are sufficiently distanced from Larmor frequency to reduce crossing effects between pumping of the atomic vapor and temperature dependency, while being within frequency range of light affecting polarization of spin moments of the atomic vapor.

More specifically, the one or more measurement points may be selected with a frequency range that is distanced from the Larmor frequency, avoiding pumping of the atomic vapor. This is as pumping of the atomic vapor hampers the temperature dependence on light absorption. On the other hand, the one or more measurement points as selected to be within a frequency range not further than a second frequency difference from the Larmor frequency to provide measurement that is affected by temperature variation, by affecting absorption and/or de-polarization of the atomic vapor. It should be noted that transmission/absorption at frequencies that are highly detuned from Larmor frequency is mostly associated with spectroscopic absorption and is generally not influenced by the magnetic field, which affect the transmission/absorption near the resonance Larmor Frequency at which magnetic field probing is to be performed. Moreover, in real time operation, where the frequency scan may preferably be limited by range to enhance measurement precision, the frequency scan limits range of the second frequency difference, thus limiting distance of the one or more measurement points from the Larmor frequency.

Thus, the controller 500 operates for determining collected intensity data at one or more measurement points in addition to identifying the Larmor frequency. The controller may further operate for determining a relation Q parameter between detuning of the one or more measurement points (with respect to the currently measured Larmor frequency) and collected intensity at the respective one or more measurement points. As indicated above, the controller further operates in a control feedback operation varying at least one of temperature of the vapor chamber and intensity of light provided by the light source, to maintain a generally constant relation Q, for example, within variation range of 5%.

In this connection, FIG. 3 illustrates first and second frequency distance measures defining a range in which the one or more measurement points fit. More specifically, a first frequency difference may be determined by $\Delta W = 1/e^2$ with respect to curve of the absorption signal, and the second frequency difference may be determined by distance of 3a from the Larmor frequency, in accordance with standard deviation a of the absorption curve around the Larmor frequency. This selection of range and of the one or more measurement points provides for calibrating operation of the optical magnetometer system based on atomic density of the atomic vapor.

In this connection, the present disclosure may utilize an estimated curve shape characterized as $$I = \frac{A}{1 + \delta\omega^2} + C$$

for describing the transition signal of the collected data. Selection of the one or more measurement points (in addition to detection of Larmor frequency) within a selected frequency range is based on the inventors understanding that the most energy is confined within curve width of $1/e^2$, and almost no energy is obtained at width above $\frac{1}{3}\sigma$ of the curve as illustrated in FIG. 3.

Figure 4:
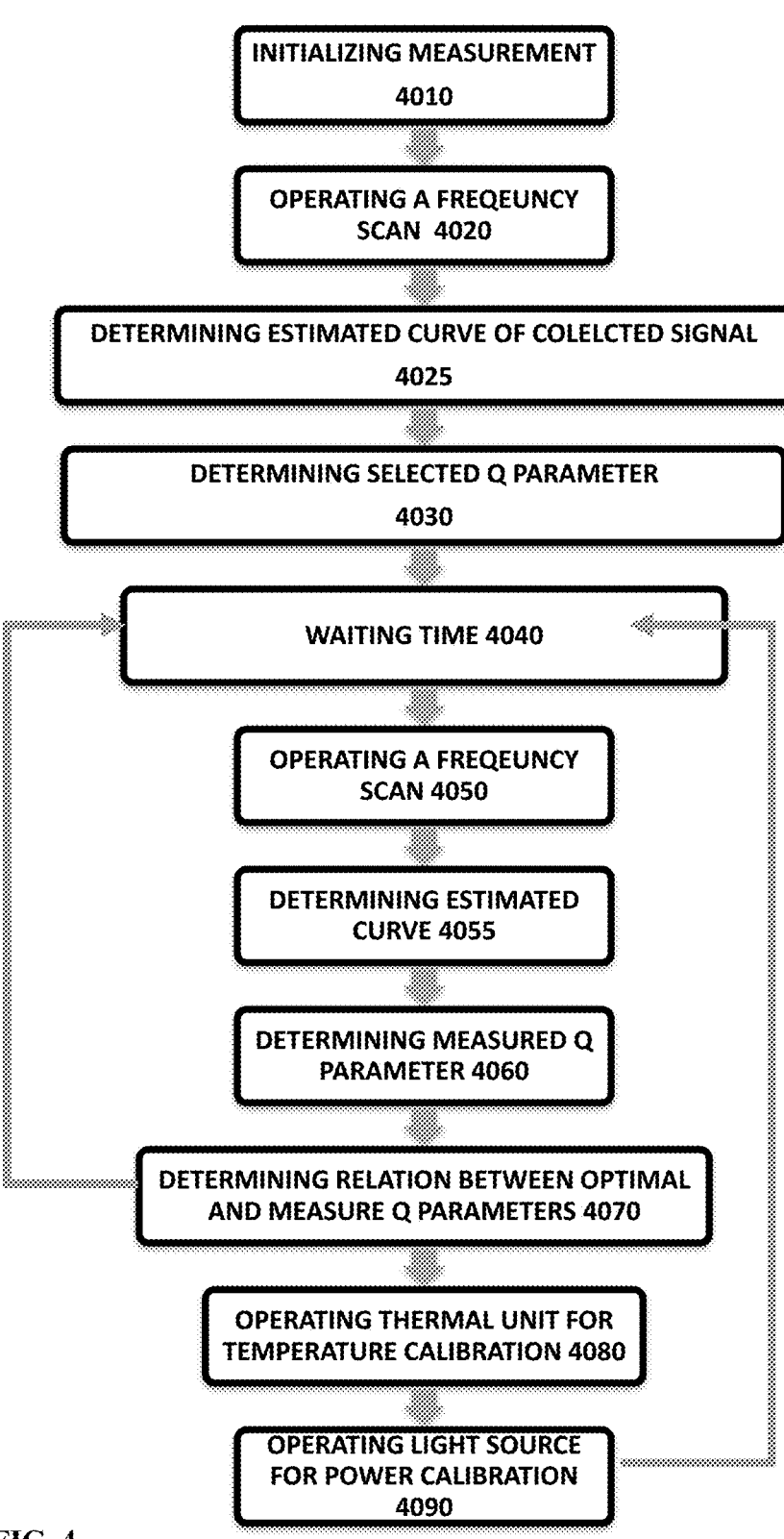
FIG. 4 shows an additional example of a method of operation of optical magnetometer system according to some embodiments of the present disclosure.

Reference is made to FIG. 4 illustrating an additional exemplary operational scheme according to some embodiments of the present disclosure. As show, following an initialization measurement 4010, preferably in known conditions, and operating of a frequency scan 4020 of illumination emission by the light source, the present disclosure may utilize determining a selected, e.g., optimal, Q parameter indicating a relation between detuning and collected power at the one or more measurement points. Generally, operating a frequency scan 4020 may also be associated with determining parameters for an estimated signal curve 4025. The curve parameters may include the instantaneous Larmor frequency $\omega_0$, the signal intensity A and a calibration offset C.

Generally, the measurement may include measurement points at $P_{1/e}^2$, $P_{3\sigma}$, and generally the central signal $P_{center}$. Each of these measurements is associated also with frequency of the measurement $\omega_{1/e}^2$, $\omega_{3\sigma}$, and Larmor frequency of central frequency $\omega_r$. Thus, the Q parameter may be determined as $$Q = \frac{\Delta P}{\delta\omega} = \frac{P_{measurement} - P_0}{\omega_{measurement} - \omega_r}$$

for the one or more measurement points. Generally, a desired value of Q parameter may be determined during initial calibration of the optical magnetometer system and stored in a memory unit for use during operation as described herein.

Following selection of a desired, optimal, value of the Q parameter, the desired value may be stored in the memory of the controller (and its PMC). This allows the optical magnetometer to operate in measurement cycles having selected sampling rate. The calibration cycle may have lower frequency such that a calibration cycle generally includes a waiting time 4040 in which the optical magnetometer operates standard measurement cycles. For example, the waiting time may include a period between 0.5 seconds and 1 or 2 minutes (or more) while the measurement cycles proceed at selected sampling frequency. In a calibration cycle, the controller may operate the light source for operating a frequency scan 4050 of light emission throughout the vapor cell, similarly to any measurement cycle. The controller may further operate the detection unit to collect detection data indicative of intensity of light collected by the detection unit for each frequency of emitted light. Processing of the detection data may include determining an estimated curve 4055, and/or determining data indicative of one or more measurement points and Larmor frequency $\omega_r$. The detected Larmor frequency may be used for generating data on current magnetic field to provide certain output data as performed in any typical measurement cycle. Using the so-determined data, the controller may operate a calibration cycle operation to determine Q parameter 4060 as defined above. The Q parameter determined at different operation/ calibration cycles are compared to the stored desired Q parameter 4070 to determine if a relation (e.g., ratio, difference, etc.) between the current and stored Q parameter values is within a predetermined threshold (e.g., 5% difference). If the determined relation is within the predetermined threshold, calibration cycle is complete, and the operation may follow to next measurement cycle. If the determined relation between Q parameter values exceeds the predetermined threshold, the optical magnetometer may need to be calibrated by adjusting vapor cell temperature 4080 by operating the thermal unit, and/or adjusting illumination intensity 4090 emitted by the light source. In some embodiments, the controller may adjust rate of calibration cycles in accordance with rate of variation of the Q parameter between calibration cycles.

Accordingly, the technique of the present disclosure may include feedback adjustment of at least one of illumination intensity and operation temperature to maintain a relation between detuning and collected intensity at one or more measurement points. The selected one or more measurement points are selected to be detuned from the resonant Larmor frequency within a selected range defined by being further than a first frequency difference and within a second frequency difference from the Larmor frequency.

As indicated above, and according to some embodiments, the present disclosure operates for maintaining atomic density and de/polarization rate during the instantaneous OPM based on estimated curve of collected signal through the vapor cell. Variation in system conditions (e.g., due to environmental temperature, magnetic gradient change, etc.) cause changes to the collected signal curve. Focusing on the resonant Larmor frequency signal provides data on variation of magnetic field, however as described above, determining additional variations that may be associated with temperature and/or atomic density can be determined by processing additional one or more measurement points along the signal curve. The present disclosure may thus provide an accurate closed loop performance optimization for the optical magnetometer system, using at least one of illumination power and temperature control (e.g., heated sensor and feedback heating control). Thus, the optical magnetometer system may provide sensitive and reproducible operation under any condition.

Figure 5:
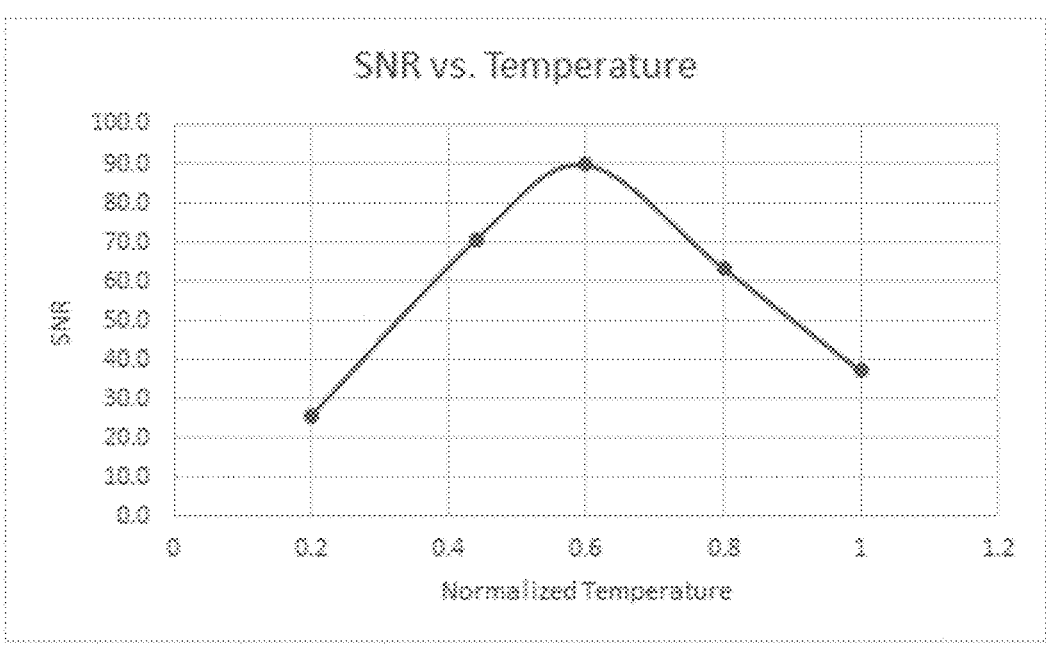
FIG. 5 illustrates signal to noise ratio dependency of temperature in optical magnetometer systems.
Figure 6:
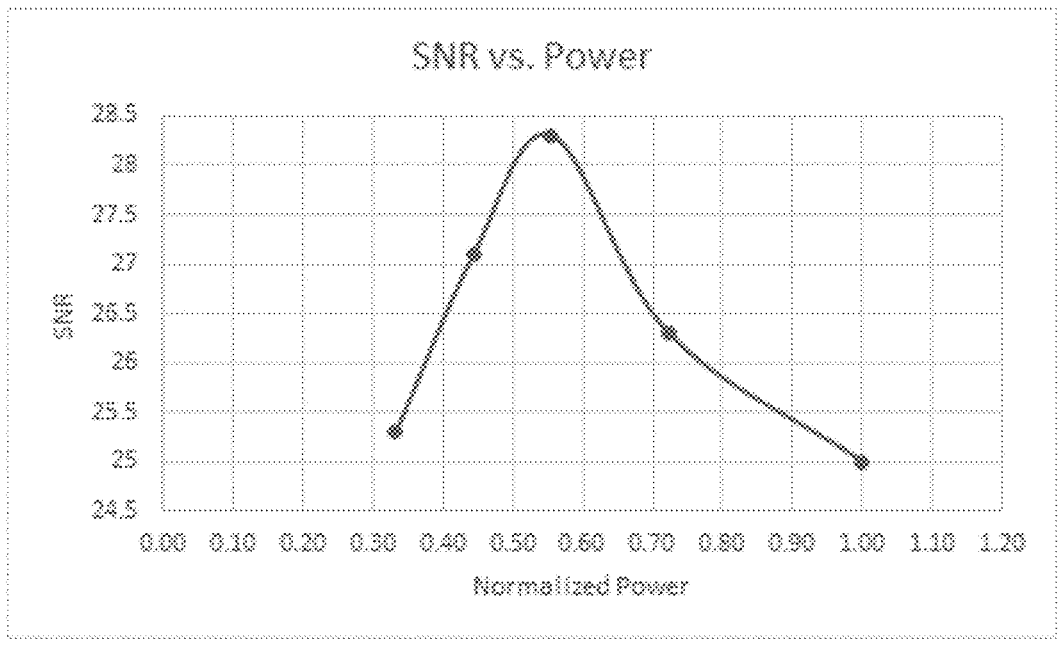
FIG. 6 illustrates signal to noise ratio dependency of light intensity in optical magnetometer systems.

Reference is made to FIGS. 5 and 6 illustrating measured signal to noise SNR data measured with respect to normalized temperature (FIG. 5) and optical intensity (FIG. 6) variations. As shown, maintaining desired operation temperature, and/or optical intensity of illumination may increase SNR of magnetic field detection enhancing operation of the optical magnetometer. Further, calibrating operation temperature and/or illumination intensity in according with the above-described technique may allow enhancing sensitivity and accuracy of detection of magnetic field variation.

Thus, the present disclosure provides for an optical magnetometer system utilizing control loop operating to maintain at least one of operation temperature and illumination intensity to preserve a desired (optimal) relation between detuning and signal intensity and one or more measurement points in addition to detection of extreme measured signal associated with Larmor frequency.

It is to be noted that the various features described in the various embodiments can be combined according to all possible technical combinations.

It is to be understood that the invention is not limited in its application to the details set forth in the description contained herein or illustrated in the drawings. The invention is capable of other embodiments and of being practiced and carried out in various ways. Hence, it is to be understood that the phraseology and terminology employed herein are for the purpose of description and should not be regarded as limiting. As such, those skilled in the art will appreciate that the conception upon which this disclosure is based can readily be utilized as a basis for designing other structures, methods, and systems for carrying out the several purposes of the presently disclosed subject matter.

Those skilled in the art will readily appreciate that various modifications and changes can be applied to the embodiments of the invention as hereinbefore described without departing from its scope, defined in and by the appended claims.

The invention claimed is:

1. An optical magnetometer system comprising:
(a) at least one light source operable for emitting one or more illumination beams and scanning illumination frequency of said one or more illumination beams over a selected frequency range;
(b) at least one vapor cell comprising vapors of one or more alkali atoms and buffer gas, and positioned to allow illumination beam from the at least one light source to pass through the vapor cell;
(c) a detection unit position to collect illumination beam passing though said at least one vapor cell and generate detection data indicative of at least one of light absorption and degree of polarization of output light emitted through the at least one vapor cell;
(d) at least one thermal unit positioned and adapted for selectively varying temperature of said at least one vapor cell; and
(e) a controller configured and operable for obtaining detection data from the detection unit and for operating said at least one thermal unit in a feedback loop to maintain a relation between optical intensity measured at one or more measurement points and detuning level of frequencies of the one or more measurement points from Larmor frequency of the optical magnetometer system;

wherein said at least one light source is configured to scan illumination frequency within a dynamic scan range, and wherein range of scanning is determined in accordance with data about Larmor frequency associated with magnetic field;
wherein the optical magnetometer being operable in cyclic sampling and wherein a measurement cycle comprises scanning illumination frequency and determining a frequency associated with an extreme value of collected light by the detection unit; and
wherein said controller operates for maintaining the relation between optical intensity measured at one or more measurement points and detuning of frequency of said one or more measurement points at a calibration sampling rate lower than measurement sampling rate of the optical magnetometer defined by measurement cycles thereof.

2. The optical magnetometer system of claim 1, wherein said at least one light source is operable for emitting one or more illumination beams having circular polarization.

3. The optical magnetometer system of claim 1, wherein said detection unit comprises at least one polarization analyzer and at least one detector unit and configured to generate output data indicative of intensity of light collected by the at least one detector unit.

4. The optical magnetometer system of claim 1, wherein said at least one light source and said detection unit are operable together to provide detection data indicative of at least one of light absorption and degree of polarization of output light for one or more illumination frequencies scanned by said at least one light source.

5. The optical magnetometer system of claim 1, wherein said scanning illumination frequency of said one or more illumination beams comprises frequency and/or amplitude scan.

6. The optical magnetometer system of claim 1, wherein said controller is configured for:
(a) obtaining, from the detection unit, detection data indicative of absorption of the respective optical magnetometer units for one or more frequencies within said frequency range;
(b) processing said detection data to determine current Larmor frequency associated with maximal absorption, and determining one or more measurement points being detuned from the current Larmor frequency;
(c) generating operational temperature instructions to vary at least one of operation temperature of the vapor cell and intensity of one or more illumination beams to maintain a relation between detuning level and measured optical intensity at said one or more measurement points.

7. The optical magnetometer system of claim 6, wherein said controller is configured to operate in a feedback loop processing to maintain a desired relation between measured optical intensity and detuning level at the selected one or more measurement points.

8. The optical magnetometer system of claim 6, wherein said controller is further configures to determine data on collected light intensity at said one or more measurement points and determining data on a Q parameter being a relation between detuning of said one or more measurement points and respective collected light intensity.

9. The optical magnetometer system of claim 8, wherein said controller further comprises pre stored data indicative of a reference Q parameter, said controller is configured to determine of a relation between said data on a Q parameter and said reference Q parameter is within a predetermined threshold, and operate said at least one thermal unit to vary operation temperature to thereby bring said relation within aid predetermined threshold.

10. The optical magnetometer system of claim 8, wherein said controller further comprises pre stored data indicative of a reference Q parameter, said controller is configured to determine if a relation between said data on a Q parameter and said reference Q parameter is within a predetermined threshold, and operate said light source to vary illumination intensity to thereby bring said relation within said predetermined threshold.

11. The optical magnetometer system of claim 9, wherein said controller is configured and operable to perform an initialization operation cycle upon initialization of operation of the optical magnetometer system, said initialization operation comprises determining said reference Q parameter and storing said reference Q parameter in a storage unit for later use.

12. The optical magnetometer system of claim 1, wherein said one or more measurement points are determined within a frequency range distanced from the Larmor frequency by at least a first frequency difference and below a second frequency difference.

13. The optical magnetometer system of claim 12, wherein curve of said detection data with respect to frequency scan is estimated by a curve having an extremum at Larmor frequency and a typical width around said extremum, said first frequency difference is determines at $1/e^2$ of the width.

14. The optical magnetometer system of claim 12, wherein curve of said detection data with respect to frequency scan is estimated by a curve having an extremum at Larmor frequency and a typical width around said extremum, said second frequency difference is determined at $3\sigma$ of the width, wherein $\sigma$ relates to standard deviation.

15. A method for operating one or more optical magnetometer units, the method comprising:

(a) directing one or more illumination beams onto one or more vapor cells and performing a frequency scan within a selected frequency range;

(b) collecting data on at least one of light absorption and degree of polarization of light passing through said one or more vapor;

(c) determining extremum in said data on at least one of light absorption and degree of polarization and determining one or more measurement points being detune from said extremum;

(d) varying at least one of temperature of said one or more vapor cells and intensity of said one or more illumination beams in a feedback loop to maintain a relation between optical intensity measured at said one or more measurement points associated with selected frequencies and detuning level of frequencies of the one or more measurement points from Larmor frequency of the optical magnetometer system;

and further comprising:

(e) obtaining, from a detection unit, detection data indicative of absorption of the respective optical magnetometer units for one or more frequencies within said frequency range;

(f) processing said detection data to determine current Larmor frequency associated with maximal absorption, and determining one or more measurement points being detuned from the current Larmor frequency;

generating operational temperature instructions to vary at least one of operation temperature of the vapor cell and intensity of one or more illumination beams to maintain a ration between detuning level and measured optical intensity at said one or more measurement points.

16. An optical magnetometer system comprising:

(a) at least one light source operable for emitting one or more illumination beams and scanning illumination frequency of said one or more illumination beams over a selected frequency range;

(b) at least one vapor cell comprising vapors of one or more alkali atoms and buffer gas, and positioned to allow illumination beam from the at least one light source to pass through the vapor cell;

(c) a detection unit position to collect illumination beam passing though said at least one vapor cell and generate detection data indicative of at least one of light absorption and degree of polarization of output light emitted through the at least one vapor cell;

(d) at least one thermal unit positioned and adapted for selectively varying temperature of said at least one vapor cell; and (e) a controller configured and operable for obtaining detection data from the detection unit and for operating said at least one thermal unit in a feedback loop, and wherein said feedback loop being directed to maintain a relation between optical intensity measured at one or more measurement points and detuning level of frequencies of the one or more measurement points from Larmor frequency of the optical magnetometer system; wherein said controller is configured for:

i. obtaining, from the detection unit, detection data indicative of absorption of the respective optical magnetometer units for one or more frequencies within said frequency range;

ii. processing said detection data to determine current Larmor frequency associated with maximal absorption, and determining one or more measurement points being detuned from the current Larmor frequency;

generating operational temperature instructions to vary at least one of operation temperature of the vapor cell and intensity of one or more illumination beams to maintain a ration between detuning level and measured optical intensity at said one or more measurement points.

* * * * *